United States Patent [19]

Payne et al.

[11] 4,169,243
[45] Sep. 25, 1979

[54] REMOTE SENSING APPARATUS

[75] Inventors: Francis L. Payne; John J. Molloy, both of Tucson, Ariz.

[73] Assignee: Burr-Brown Research Corp., Tucson, Ariz.

[21] Appl. No.: 901,129

[22] Filed: Apr. 28, 1978

[51] Int. Cl.² ............................................. G01R 27/02
[52] U.S. Cl. ................................. 324/62; 73/362 AR
[58] Field of Search .................. 324/62; 73/362 AR; 364/557, 863

[56] References Cited

U.S. PATENT DOCUMENTS

| | | | |
|---|---|---|---|
| 3,437,925 | 4/1969 | Gillette | 324/62 |
| 3,503,261 | 3/1970 | Riester et al. | 324/62 |
| 3,817,104 | 6/1974 | Sapir | 73/362 AR |
| 3,924,470 | 12/1975 | Sander | 73/362 AR |
| 4,000,454 | 12/1976 | Brakl | 73/362 AR X |
| 4,060,715 | 11/1977 | Scott | 364/863 X |
| 4,109,196 | 8/1978 | Carmody | 324/62 |

FOREIGN PATENT DOCUMENTS

| | | | |
|---|---|---|---|
| 2122561 | 11/1972 | Fed. Rep. of Germany | 324/62 |
| 2503515 | 7/1975 | Fed. Rep. of Germany | 324/62 |
| 2447629 | 4/1976 | Fed. Rep. of Germany | 324/62 |
| 474749 | 10/1975 | U.S.S.R. | 324/62 |

*Primary Examiner*—Stanley T. Krawczewicz
*Attorney, Agent, or Firm*—Harry M. Weiss

[57] ABSTRACT

This relates to a circuit for generating a voltage which is proportional to changes in the resistance of a remote resistive sensing element, due to, for example, changes in temperature, pressure (such as from a strain gauge), etc. The sensing element is coupled to the circuit by three lead wires each having lead wire resistance. Means including first and second operational amplifiers are provided for cancelling errors in the output voltage due to voltage drops in the lead wires.

8 Claims, 2 Drawing Figures

REMOTE SENSING APPARATUS

BACKGROUND OF THE INVENTION

1. Field of the Invention

This invention relates generally to remote sensing devices, and more particularly to a circuit which compensates for lead wire resistance to provide a linear voltage output when coupled to a remote resistive sensing element.

2. Description of the Prior Art

In devices such as strain gauges and resistive temperature measuring devices, it is often necessary to employ a resistive sensing device remotely located from its associated instrumentation circuits.

Strain gauges are devices which rely on changes in electrical resistance when the resistive measuring element is subjected to forces of tension or compression. Such devices are used in scales, pressure sensors, vibration monitors, etc. The resistive element or network of elements is typically mounted in an enclosure which is in turn mounted on or near the device or area to be monitored. Two or more lead wires from the resistive elements are coupled to an electronic installation which may be located as much as thousands of feet from the sensing elements. If wire of a reasonable size (e.g., 22–20 wire) is employed, the lead wire resistance soon becomes appreciable when compared to that of the sensor which is typically 50–500 ohms.

It is usually necessary to use a bridge of four elements mounted at the sensing point. If four elements are not required by the particular application, bridge completion resistors are contained within the device. The bridge is excited by a current source via a first pair of wires, and the output voltage is returned over a second pair of wires. A third pair of wires may be used for remote voltage sensing and control. Current sources or voltage sensing are required due to voltage drops caused by the lead wire resistances.

Temperature sensing using platinum wire or nickel alloy temperature sensing elements is well known and is considered the most accurate commonly used method of industrial temperature sensing. The platinum wire element typically has a resistance of only 100 ohms at room temperature while the nickel alloy element may have a resistance of 1000 ohms. While the nickel alloy element is therefore easier to instrument, the platinum wire element is preferred for its accuracy and long term stability.

Temperature sensing elements do not usually employ bridge completion resistors which makes instrumentation for automatic read-out especially difficult. Manual read-out is possible using a potentiometer and galvanometer with three lead wires. While such an arrangement yields a linear output with no errors due to lead wire voltage drops, this arrangement is not suitable for continuous automatic read-out which is becoming increasingly important with the increased use of microprocessors in automatic control systems.

U.S. Pat. No. 3,817,104 describes a temperature measuring voltage to current converter including a temperature-responsive resistance bridge. However, the apparatus taught in this patent includes no means for compensating for lead wire resistance. Further, the apparatus produces a non-linear response due to the use of the resistive bridge.

U.S. Pats. Nos. 4,000,454 and 4,060,715 address the problem of linearizing the non-linearity of the sensing element; however, the arrangements taught include no means for accomplishing lead wire resistance compensation.

Finally, U.S. Pat. No. 3,924,470 teaches a temperature measurement circuit employing three lead wires which in itself offers some relief from the problem of lead wire resistance. However, such relief extends only to short lead wires resulting in small changes in the resistance of the resistive sensing element.

SUMMARY OF THE INVENTION

It is an object of the present invention to provide a remote resistive sensing apparatus which automatically provides compensation for voltage drops caused by lead wire resistance.

It is a further object of the invention that only three lead wires be required.

It is a still further object of the invention that the inventive apparatus be voltage excited and suitable for use in situations which require continuous automatic read-out.

Finally, it is an object of the invention to provide a remote resistive sensing apparatus employing a single element for one dimensional sensing and only three lead wires wherein no adjustments are required for wire lead length of non-linearities introduced by the instrumentation electronics without requiring complex electronic or electro-mechanical servo loops.

According to a broad aspect of the invention there is provided a circuit for producing an output proportional to changes in the resistance of a remote resistive sensing element which is coupled to said circuit by a plurality of lead wires having lead wire resistances, comprising of generating means for producing a voltage proportional to changes in the resistance of said element; and compensating means coupled to said generating means for substantially canceling errors in said voltage due to said lead wire resistances.

The foregoing and other objects, features and advantages of the invention will be apparent from the following, more detailed, description of a preferred embodiment taken in conjunction with the accompanying drawings, in which:

DESCRIPTION OF THE PREFERRED EMBODIMENT

Figure 1:
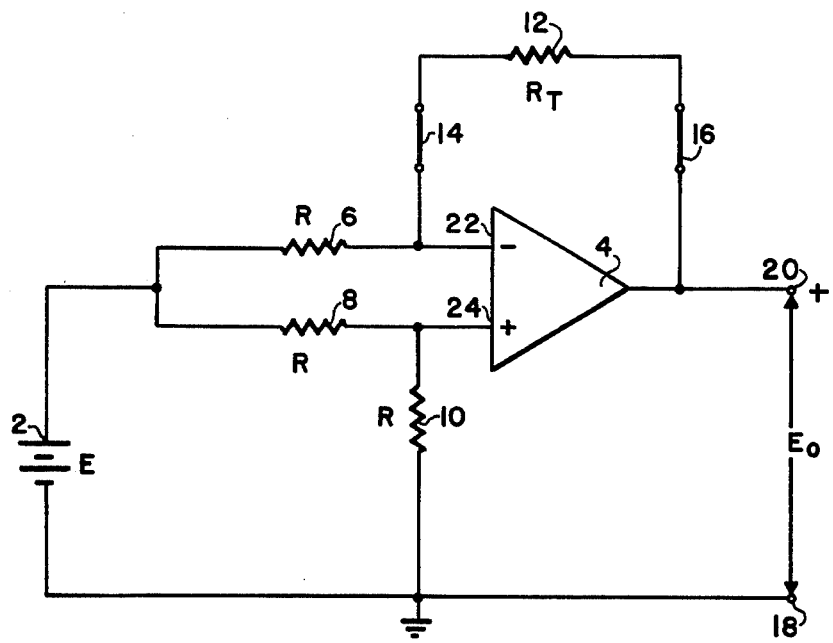
FIG. 1 is a schematic diagram of a remote resistive sensing apparatus according to the prior art.

Referring to FIG. 1, there is shown a voltage excited remote resistive sensing apparatus according to the prior art. A battery 2 generates a voltage E which is applied to the junction of resistors 6 and 8 each having a resistance R. Resistors 6 and 8 are coupled to inputs 22 and 24 respectively of operational amplifier 4; e.g., a National Semiconductor LM108. A third resistor 10 having a resistance R forms a voltage divider with resistor 8 to set the DC level at input 24. A resistor 12 having a resistance $R_T$ forms the remote resistive sensing element and is coupled across input 22 and the output of operational amplifier 4 by lead wires 14 and 16. The output voltage $E_O$ which appears across terminals 18 and 20 varies with changes in $R_T$ which occur as the temperature varies.

Applying conventional electrical circuit analysis it can be shown that:

$$E_O = \frac{E}{2}\left(\frac{R - R_T}{R}\right) \quad \text{(Equation 1)}$$

Thus, if R is chosen to have the value $R_T$ at, for example, room temperature, then $E_O$ will be negative when $R_T$ rises above R and positive when $R_T$ falls below R.

The above analysis does not take into consideration the resistance ($R_L$) in each of lead wires 14 and 16 which, as previously described, may be appreciable. To do so, equation 1 must be modified to read $$E_O = \frac{E}{2}\left(\frac{R - R_T - 2R_L}{R}\right). \quad \text{(Equation 2)}$$

Clearly, $E_O$ is not an accurate representation of changes in $R_T$ but is substantially affected by the lead wire resistance, i.e., $2R_L$.

Figure 2:
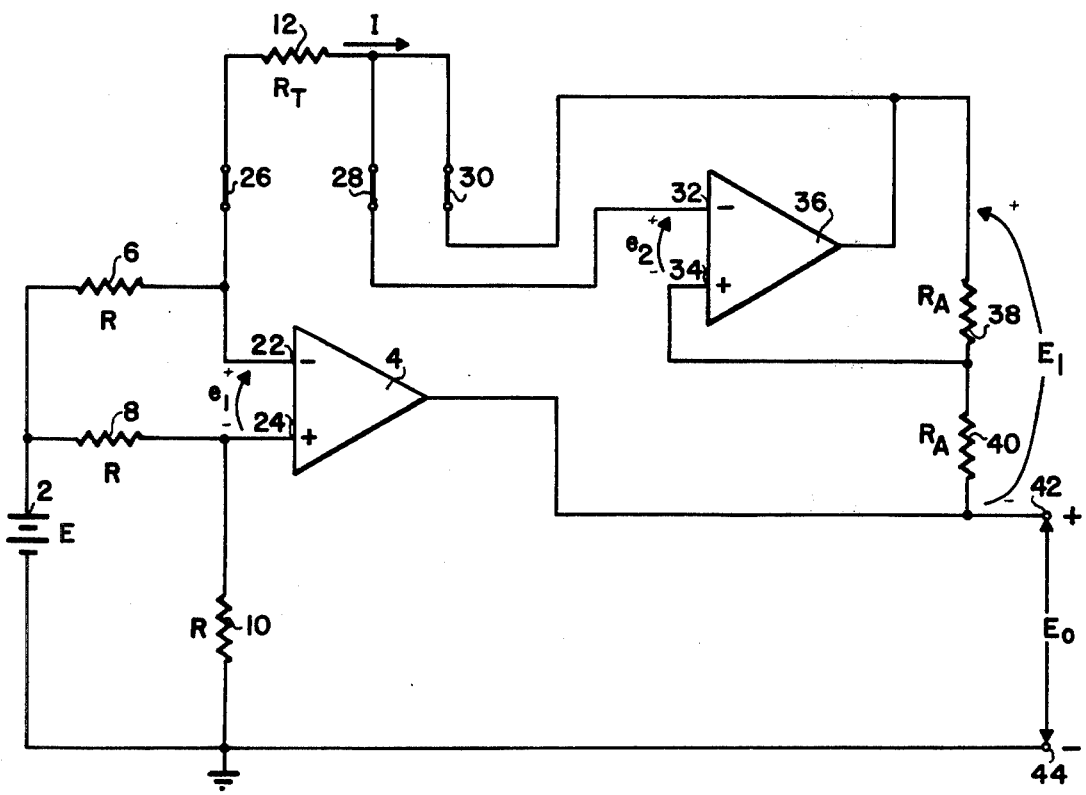
FIG. 2 is a schematic diagram of a remote resistive sensing apparatus according to the present invention.

FIG. 2 is a schematic diagram of a voltage excited remote resistive sensing apparatus which includes means for canceling lead resistance errors. A portion of the circuit is identical to that of FIG. 1; thus, like elements are denoted by like numerals. Specifically, the circuit of FIG. 2 includes a voltage source 2 for applying E volts to the junction of resistors 6 and 8 each having a resistance R which are in turn coupled to inputs 22 and 24 respectively of operational amplifier 4. Likewise, a resistor 10 having a resistance R forms a voltage divider with resistor 8 to set the D. C. level of amplifier input 24. Resistor 12 having a resistance $R_T$ is again employed as the remote sensing element; however, resistor 12 is coupled to the rest of the circuit by three lead wires 26, 28 and 30 instead of two. Each of the lead wires has a lead resistance of $R_L$.

Lead wire 26 couples resistor 12 to resistor 6 and input 22 of amplifier 4. Lead wire 28 couples resistor 12 to the inverting input 32 of operational amplifier 36. Finally, lead wire 30 couples resistor 12 to the output of amplifier 36 and to resistor 38 having a resistance $R_A$. To complete the circuit, the non-inverting input 34 of amplifier 36 is coupled to the junction of resistors 38 and 40, resistor 40 also having a resistance $R_A$.

The additional circuitry in FIG. 2 cancels the voltage drops caused by the exication current I flowing through the lead wire resistances. Since the current drawn by the inverting input 32 of operational amplifier 36 is insignificant, only one $R_L$ voltage drop (lead wire 30) is impressed between the output of amplifier 36 and its inverting input 32. The open loop gain of amplifier 36 can be assumed infinite, and if the circuit is stable without driving amplifier 36 into saturation, the voltages at the inverting and non-inverting inputs 32 and 34 respectively must be equal. This condition can only be satisfied if the output voltage is two $R_L$ drops below output voltage $E_O$. This is accomplished by equal resistors 38 and 40 which form a divide by two voltage divider which operates on the voltage $E_1$ across the outputs of amplifiers 4 and 36.

For reasonable resistor values, the offset voltages of the amplifiers and their temperature dependence are predominant sources of error. However, if the offset voltages e1 and e2 of amplifiers 4 and 36 respectively are matched and track over temperature, offset and offset temperature drift due to the offset voltages e1 and e2 will be reduced to the tracking mismatch as is shown by the following analysis. Referring to FIG. 2, $$(E_1/2)+e2=E1+IR_L \quad \text{(Equation 3)}$$

Rearranging
$$(E_1/2)=e2-IR_L$$

or
$$E_1=-2IR_L+2(e2) \quad \text{(Equation 4)}$$

For the exication circuit using the voltage divider formula and loop analysis $$\frac{E}{2} + e1 = E - [E- (E_O-2IR_L + 2(e2) + 2IR_L)]\left(\frac{R}{R + R_T}\right)$$

where the terms $-2IR_L+2(e2)=E_1$ from Equation 4
Canceling the $2IR_L$ terms and rearranging the remaining terms:

Rearranging terms:

$$\frac{E}{2} + e1 = E - (E-E_O-2(e2))\left(\frac{R}{R + R_T}\right) \quad \text{(Equation 5)}$$

$$\frac{E}{2} + e1 = E\left(1 - \frac{R}{R + R_T}\right) + \frac{E_O R}{R + R_T} + \frac{2(e2)R}{R + R_T} -$$

$$\frac{E_O R}{R + R_T} = E\left(1 - \frac{R}{R + R_T}\right) - e1 + \frac{2(e2)R}{R + R_t} -$$

$$E_O = E\left(\frac{R + R_T}{2R} -1\right) - e1\left(\frac{R + R_T}{R}\right) + 2(e2) -$$

$$E_O = \frac{E}{2}\left(\frac{R_T - R}{R}\right) - e1\left(\frac{R + R_T}{R}\right) + 2(e2)$$

Since in most applications $R_T \approx R$, then $$-E_O = \frac{E}{2}\left(\frac{R_T - R}{R}\right) - 2(e1) + 2(e2) \quad \text{(Equation 6)}$$

For monolithic bipolar input amplifiers, offset matching assures drift tracking to a high degree; therefore, drift matched operational amplifier pairs are easily obtained.

From the above description, it should be clear that there has been provided a voltage excited remote sensing apparatus which employs the industry accepted three-wire connection and cancels errors due to lead wire voltage drops for all reasonable values of $R_L$. Since voltage excitation is employed, many circuits can be excited by the same precision reference supply voltage. The circuit provides a linear output regardless of the mismatch between $R_T$ and R and requires no complex electromechanical servo loops for automatic and continuous read-out. Finally, drift matched pairs of operational amplifiers can be employed to reduce offset errors.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for producing an output proportional to changes in the resistance of a remote resistive sensing element which is coupled to said circuit by a plurality of lead wires having lead wire resistances, comprising:

generating means for producing a voltage proportional to changes in the resistance of said element, said generating means including:

first amplifying means having an output and inverting and non-inverting inputs for generating said voltage;

first resistive means having a resistance R coupled to said inverting input and coupled to said element via a first one of said lead wires; and a voltage divider coupled to said non-inverting input for applying a potential thereto;

second and third resistive means coupled between a second one of said lead wires and the output of said first amplifying means; and compensating means coupled to said generating means for substantially cancelling errors in said voltage due to said lead wire resistances.

2. A circuit according to claim 1 wherein said element is coupled to said circuit by three lead wires.

3. A circuit according to claim 2 wherein said voltage divider comprises fourth and fifth resistive means each having a resistance R.

4. A circuit according to claim 2 wherein said compensating means comprises:

second amplifying means having an output and inverting and non-inverting inputs, said inverting input coupled to said element by a third one of said lead wires, said second resistive means coupled across the output and non-inverting input of said second amplifying means.

5. A circuit according to claim 4 wherein said third resistive means is coupled across the output of said first amplifying means and the non-inverting input of said second amplifying means.

6. A circuit according to claim 5 wherein said second and third resistive means have substantially equal resistances.

7. A circuit according to claim 4 wherein said first and second amplifying means are operational amplifiers.

8. A circuit according to claim 1 further including a source of voltage for powering said circuit.

* * * * *